United States Patent
Wada

(10) Patent No.: US 6,830,979 B2
(45) Date of Patent: Dec. 14, 2004

(54) METHOD FOR FABRICATING SEMICONDUCTOR DEVICE

(75) Inventor: Yukihisa Wada, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 87 days.

(21) Appl. No.: 10/152,334

(22) Filed: May 22, 2002

(65) Prior Publication Data

US 2003/0017686 A1 Jan. 23, 2003

(30) Foreign Application Priority Data

May 23, 2001 (JP) ........................................ 2001-153388

(51) Int. Cl.⁷ ............................................. H10L 21/336
(52) U.S. Cl. ..................................... 438/303; 438/704
(58) Field of Search ................................. 438/303, 704

(56) References Cited

U.S. PATENT DOCUMENTS

| | | | |
|---|---|---|---|
| 5,869,866 A | * | 2/1999 | Fulford et al. .............. 257/347 |
| 6,093,594 A | * | 7/2000 | Yeap et al. .................. 438/231 |
| 6,174,756 B1 | * | 1/2001 | Gambino et al. ........... 438/163 |
| 6,391,793 B2 | * | 5/2002 | Lee et al. .................... 438/745 |
| 6,689,284 B1 | * | 2/2004 | Nakasaki ..................... 216/64 |
| 2002/0127763 A1 | * | 9/2002 | Arafa et al. .................. 438/76 |
| 2003/0011017 A1 | * | 1/2003 | Lee et al. .................... 257/314 |

* cited by examiner

Primary Examiner—W. David Coleman
(74) Attorney, Agent, or Firm—McDermott Will & Emery LLP

(57) ABSTRACT

There is provided a method for fabricating a semiconductor device involving the formation of two or more oxide films having different etching properties. A multilayer-film sidewall including a first oxide film such as an NSG film, a TEOS film, or a HTO film and a second oxide film such as a BPSG film or a PSG film is formed over the side surfaces of a gate electrode. After the multilayer-film sidewall is used as an implantation mask for forming the source and drain of a MIS transistor, wet etching is performed by using an aqueous solution mixture containing a hydrofluoric acid and an inorganic acid (a hydrochloric acid, a sulfuric acid, or the like) in selectively removing the second oxide film. This increases the etching selectivity between the individual oxide films and allows the removal of only the upper-layer second oxide film.

17 Claims, 6 Drawing Sheets

Fig. 6

| HCl(%) | pH | Etching Rate (nm/min) | | | | | Selectivity | | | | | |
|---|---|---|---|---|---|---|---|---|---|---|---|---|
| | | SiO2 | NSG | BPSG | SiN | PS | BPSG/SiO2 | BPSG/NSG | SiO2/SiN | BPSG/SiN | BPSG/PS |
| 0.00 | 2.20 | 0.21 | 1.36 | 4.28 | 0.11 | 0.02 | 20.4 | 3.1 | 1.9 | 38.9 | 237.8 |
| 0.03 | 1.69 | 0.19 | 1.18 | 4.73 | | | 25.2 | 4.0 | | | |
| 0.12 | 1.09 | 0.16 | 0.98 | 5.26 | | | 32.9 | 5.4 | | | |
| 0.30 | 0.79 | 0.15 | 0.93 | 5.51 | 0.07 | 0.02 | 36.7 | 5.9 | 2.1 | 78.7 | 306.1 |
| 0.60 | 0.41 | 0.13 | 0.87 | 5.98 | 0.05 | 0.02 | 47.8 | 6.9 | 2.5 | 119.6 | 332.2 |

↓ HF/HCL

↓ Dry Etching of Si
  Ashing/Cleaning

Fig. 7E ↓ HF/HCL

METHOD FOR FABRICATING SEMICONDUCTOR DEVICE

BACKGROUND OF THE INVENTION

The present invention relates to a method for fabricating a semiconductor device using a multilayer film composed of two or more oxide films having different properties in a fabrication process therefor and, more particularly, to selective wet etching of the multilayer film.

In ULSI devices each composed of a large number of elements integrated therein, the recent technological trends have been toward further miniaturization, higher density, higher speed, and lower power consumption. In keeping with the trends, the elements composing the ULSI devices have been scaled down increasingly. As the scaling down of the elements proceeds, the thinning of films partly composing the elements and the size reduction of the individual parts thereof are approaching their limits so that the thickness reduction of the films and unexpected deformation of the individual parts are no more negligible. In the case of performing a wet etching process with respect to a multilayer film, control of etching selectivity between the individual films composing the multilayer film is becoming particularly important.

In selectively removing an oxide film in the conventional process of fabricating a ULSI containing a MIS transistor, a vapor-phase HF etching and wet etching using a hydrofluoric acid or a buffered hydrofluoric acid have been used frequently.

If an oxide film having a process damage is to be left by selectively etching a BPSG film (PSG film) through the foregoing vapor-phase HG etching process, however, the oxide film intended to be left may be etched by HF due to a change in the etching properties thereof.

If the hydrofluoric acid or buffered hydrofluoric acid each used commonly to selectively remove only one of two or more oxide films having different etching properties, the oxide film intended to be left is removed disadvantageously due to the low selectivity of the hydrofluoric acid or buffered hydrofluoric acid to the oxide films of different types so that an oxide film having a desired configuration and a desired thickness is not formed.

If wet etching using the hydrofluoric acid or buffered hydrofluoric acid is performed with respect to a silicon substrate or a polysilicon member having a silicon layer with an exposed surface, a stain may occur on the surface of the silicon layer. Upon contact with an atmosphere containing cobalt (Co) or titanium (Ti) during the formation of, e.g., a silicide film in the subsequent step, a Co film or a Ti film is deposited on the stain. As a result, the process of silicidization in the surface portion of the Si substrate is inhibited and a failure may be caused thereby in the semiconductor device.

SUMMARY OF THE INVENTION

It is therefore an object of the present invention to provide means for circumventing the lowering of an etching selectivity in selectively etching one of two oxide films with different properties such as an NSG film and a BPSG film and thereby properly keep the thicknesses and configurations of the oxide films of an element.

A first method for fabricating a semiconductor device according to the present invention is a method for fabricating a semiconductor device having a MIS transistor composed of a gate insulating film provided on a semiconductor substrate and a gate electrode provided thereon, the method comprising the steps of: (a) forming a sidewall including a first oxide film and a second oxide film having different etching properties over side surfaces of the gate electrode; (b) performing ion implantation for forming source/drain regions by using the sidewall as a mask; and (c) etching the sidewall by using an aqueous solution mixture containing a hydrofluoric acid and an inorganic acid to selectively remove the second oxide film.

In accordance with the methods an amount of etching of the first oxide film which should not be etched is reduced by etching using the aqueous solution mixture containing the hydrofluoric acid and the inorganic acid and having a high selectivity.

The step (a) includes forming a nondoped silicon oxide film as the first oxide film and forming a doped silicon oxide film as the second oxide film. The arrangement achieves a reduction in the amount of etching of the first oxide film by using the property of the aqueous solution mixture containing the hydrofluoric acid and the inorganic acid, which is a high etching selectivity to each of the nondoped oxide film and the doped oxide film.

Preferably, the nondoped silicon oxide film is an NSG film, a TEOS film, a HTO film, or a plasma oxide film and the doped oxide film is a BPSG film, a PSG film, or a BSG film.

Preferably, the step (c) includes using, as the aqueous solution mixture, an aqueous solution containing a hydrofluoric acid at a concentration selected from the range of 0.01 to 1.0 wt % and an inorganic acid at a concentration selected from the range of 0.001 to 30.0 wt %.

Preferably, the step (c) includes using a hydrochloric acid, a sulfuric acid, or a nitric acid as the inorganic acid.

The present invention is applicable to either of the cases where the gate electrode is composed of polysilicon, polymetal, or metal.

The method further comprises, after the step (c), the step of cleaning with a solution containing an aqueous hydrogen peroxide or an aqueous ozone. The arrangement allows the formation of a stable chemical oxide film on the substrate surface and suppresses the occurrence of a stain.

In that case, a concentration of the hydrogen peroxide in the solution containing the aqueous hydrogen peroxide is preferably in the range of 0.01 to 30.0 wt % and a concentration of the ozone in the solution containing the aqueous ozone is preferably in the range of 0.1 to 150.0 ppm.

The step (a) includes the substeps of: forming the first oxide film over an upper surface and side surfaces of the gate electrode; forming a nitride film on the first oxide film: forming a second oxide film on the nitride film; and etching back the second oxide film to form a multilayer-film sidewall composed of a two-layer film including the first oxide film and the nitride film each having a generally L-shaped configuration and of the second oxide film having a sectoral configuration and the step (c) includes forming, on the side surfaces of the gate electrode, a two-layer-film sidewall composed of the first oxide film and the nitride film each having a generally L-shaped configuration. Even if the MIS transistor is miniaturized, the arrangement ensures the burying of the interlayer insulating film by keeping a wide spacing between gate electrodes.

A second method for fabricating a semiconductor device according to the present invention comprises the steps of: (a) forming, on a substrate, a multilayer film including two insulating films having different etching properties; and (b)

selectively etching away the multilayer film by using an aqueous solution mixture of a hydrofluoric acid and an inorganic acid, the step (b) includes increasing an etching selectivity between the two insulating films by using the aqueous solution mixture.

In accordance with the method, an amount of etching of the insulating film which should not be etched is reduced by etching the aqueous solution mixture containing the hydrofluoric acid and the inorganic acid and having a high selectivity.

Preferably, each of the insulating films is a silicon oxide film, a silicon nitride film, or a silicon oxynitride film.

Preferably, the step (b) includes using, as the aqueous solution mixture, an solution containing a hydrofluoric acid at a concentration selected from the range of 0.01 to 1.0 wt % and an inorganic acid at a concentration selected from the range of 0.001 to 30.0 wt. %.

A third method for fabricating a semiconductor device according to the present invention is a method for fabricating a semiconductor device having a MIS transistor, the method comprising the steps of: (a) forming a gate oxide film on a surface of a semiconductor substrate; (b) forming, on the gate oxide film, a gate electrode with the gate oxide film being nearly entirely left; (c) forming, over side surfaces of the gate electrode, a sidewall including an oxide film having an etching property different from an etching property of the gate oxide film and removing an exposed portion of the gate oxide film; (d) performing ion implantation for forming source/drain regions by using the sidewall as a mask; (e) etching the sidewall by using an aqueous solution mixture of a hydrofluoric acid and an inorganic acid; and (f) after the step (e), cleaning the semiconductor substrate by using a solution containing an aqueous hydrogen peroxide or an aqueous ozone.

In accordance with the method, an amount of etching of the first oxide film which should not be etched is reduced by etching the aqueous solution mixture containing the hydrofluoric acid and the inorganic acid and having a high selectivity, while a stable chemical oxide film can be formed on the surface if the semiconductor substrate surface is exposed, so that the occurrence of a stain is suppressed.

Preferably, the step (f) includes: adjusting a concentration of the hydrogen peroxide in the solution containing the aqueous hydrogen peroxide to a value selected from the range of 0.01 to 30.0 wt %; or adjusting a concentration of the ozone in the solution containing the aqueous ozone to a value selected from the range of 0.1 to 150.0 ppm.

A fourth method for fabricating a semiconductor device according to the present invention is a method for fabricating a semiconductor device including an insulating film for isolation, the method comprising the steps of: (a) successively forming, on a semiconductor substrate, a protective film and an anti-oxidation film having different etching properties; (b) patterning the anti-oxidation film to form an etching mask therefrom; (c) etching the protective film covered with the etching mask by using an aqueous solution mixture containing a hydrofluoric acid and an inorganic acid to leave a pad film under the etching mask; (d) performing dry etching with respect to the semiconductor substrate with the etching mask being attached thereto to form a trench therein; and (e) etching side-surface portions of the pad film exposed in the trench by using an aqueous solution mixture containing a hydrofluoric acid and an inorganic acid.

In accordance with the method, variations in the size of the etching mask composed of the anti-oxidation film can be suppressed by performing, in the steps (c) and (e), etching using the aqueous solution mixture containing the hydrofluoric acid and the inorganic acid and having a high etching selectivity.

The step (a) includes forming a silicon oxide film as the protective film and forming a silicon nitride film as the anti-oxidation film. This achieves a high etching selectivity.

Preferably, each of the steps (c) and (e) includes using, as the aqueous solution mixture, an aqueous solution containing a hydrofluoric acid at a concentration selected from the range of 0.01 to 1.0 wt % and an inorganic acid at a concentration selected from the range of 0.001 to 30.0 wt %.

The method further comprises, after the steps (c) and (e), the step of cleaning with solution containing an aqueous hydrogen peroxide or an aqueous ozone. The arrangement allows the formation of a stable chemical oxide film on the substrate surface and suppresses the occurrence of a stain.

Preferably, a concentration of the hydrogen peroxide in the solution containing the aqueous hydrogen peroxide is in the range of 0.01 to 30.0 wt % and a concentration of the ozone in the solution containing the aqueous ozone is in the range of 0.1 to 150.0 ppm.

A fifth method for fabricating a semiconductor device according to the present invention is a method for fabricating a semiconductor device including a capacitor electrode having a closed-end cylindrical structure composed of polysilicon, the method comprising the steps of: (a) forming an interlayer film on a semiconductor substrate; (b) forming, on the interlayer film, a spacer layer having an etching property different from an etching property of the interlayer film; (c) etching the spacer layer to form a cylindrical spacer having a depressed portion; (d) forming, on the substrate, a doped silicon film and resist film and etching-back the resist film and the doped silicon film to leave a closed-end cylindrical structure composed of the doped silicon film along wall portions of the depressed portion; and (e) etching the spacer layer by using an aqueous solution mixture containing a hydrofluoric acid and an inorganic acid to expose inner and outer wall surfaces of the closed-end cylindrical structure.

The method ensures etching away by using such a wet etching method for the selective etching of the spacer layer in the step (e) without causing etching residues, particles, and the like which have presented problems to vapor-phase HF used conventionally.

Preferably, the step (a) includes forming a nondoped silicon oxide film as the interlayer film and the step (b) includes forming a doped silicon oxide film as the spacer layer Preferably, the spacer layer is composed of a silicon oxide film containing at least phosphorus.

The method further comprises the steps of: prior to the step (b), forming a nitride film on the interlayer film and after the step (c) and prior to the step (d), etching away a portion of the nitride film located on a bottom surface of the depressed portion to form a nitride film mask, wherein the step (e) includes performing etching with the nitride film mask being attached. This protects the interlayer film from being etched.

Preferably, the step (e) includes using, as the aqueous solution mixture, an aqueous solution containing a hydrofluoric acid at a concentration selected from the range of 0.01 to 1.0 wt % and an inorganic acid at a concentration selected from the range of 0.001 to 30.0 wt %.

BRIEF DESCRIPTION OF THE DRAWINGS

FIG. 6 is a view showing, as a table, respective etching rates for various oxide films and selectivities therebetween obtained as a result of an experiment for etching evaluation performed by using different wet etching solutions;

FIGS. 7A to 7G are cross-sectional views illustrating fabrication process steps for a semiconductor device according to a second embodiment of the present invention.

DETAILED DESCRIPTION OF THE INVENTION

EMBODIMENT 1

Figure 1:
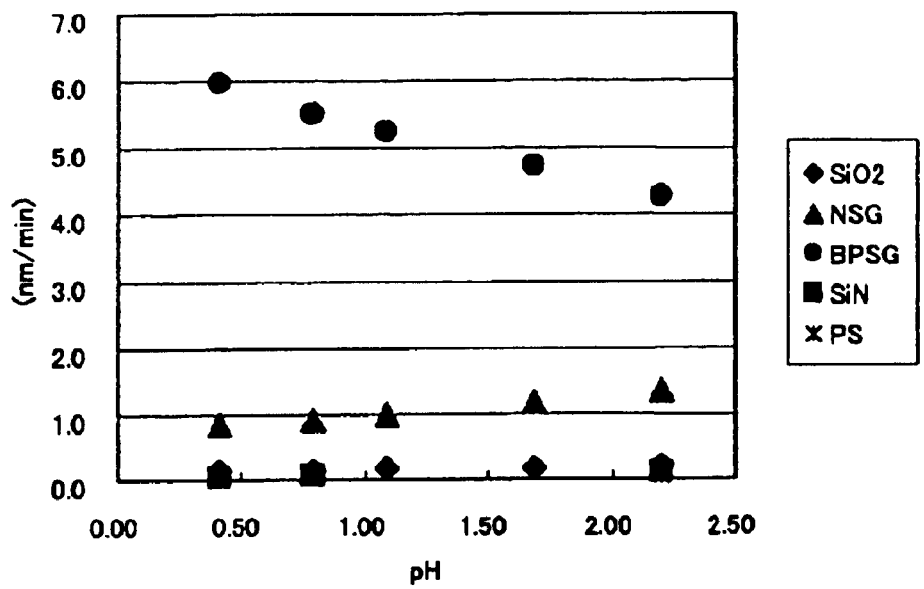
FIG. 1 is an etching-rate/pH interrelation diagram showing respective etching rates (nm/minute) for individual oxide films which are plotted versus pHs that have been controlled by adjusting the concentration of HCL.

Referring to the drawings, a method for fabricating a semiconductor device according to a first embodiment of the present invention will be described herein below in detail.
Result of Experiment as Basis for Invention As wet etching solutions for selective etching, the experiment used aqueous solution mixtures each containing a diluted hydrofluoric acid (hereinafter referred to as DHF) and a hydrochloric acid (hereinafter referred to as HCL).

FIG. 6 is a view showings as a table, respective etching rates for various oxide films and selectivities therebetween obtained as a result of the experiment for etching evaluation performed by using the different wet etching solutions. The experiment was performed as follows.

Samples were prepared by individually depositing a thermal oxide silicon film (hereinafter referred to as the th-SiO$_2$ film) on a silicon substrate, an NSG film on a silicon substrate by normal pressure CVD, a BPSG (boron concentration; 3.5%, phosphorus concentration 4.5%) film on a silicon substrate by normal pressure CVD, a nitride film on a silicon substrate by low pressure CVD (hereinafter referred to as LP-SiN), and depositing a phosphorus-doped polysilicon film (hereinafter referred to as DPS) on a silicon substrate. Of these samples, the ones formed with the NSG film and the PBSG film were subjected to a rapid thermal annealing (hereinafter referred to as RTA) process performed at 800° C. for 10 seconds, Each of the processed samples was immersed in each of aqueous solution mixtures of an aqueous hydrofluoric acid solution containing HF at a concentration of 0.1% expressed as a weight percentage and aqueous hydrochloric solutions added thereto for ph control. The aqueous hydrochloric solutions for pH control had respective HCL concentrations adjusted to 0.03%, 0.12%, 0.3%, and 0.6%. Each of the samples was immersed sequentially in the aqueous solution mixtures at the individual concentrations each for 5 minutes. After the samples were cleaned with pure water and dried, etching rate and the etching selectivities between the different oxide films were obtained for the samples. The drawing shows the BPSG-film/thermal-oxide film etching selectivities and the BPSG-film/NSG-film etching selectivities at the individual HCL concentrations and at the pHs corresponding thereto.

FIG. 1 is an etching-rate/pH interrelation diagram showing respective etching rates (nm/minute) for the individual oxide films shown in FIG. 6 which are plotted verses the pHs that have been controlled by adjusting the HCL concentration described above. FIG. 9 is a view showing, as a table, the dependency of the etching rates for the individual oxide films and the selectivities therebetween on the HF concentrations. FIG. 10 is a view showing, as a table, the dependency of the etching rates for the individual oxide films and the selectivities therebetween on the pH values.

As shown in FIG. 1, the etching rate for the th-SiO$_2$ film (simply referred to as the SiO$_2$ film in FIG. 6) which is the thermal oxide film decreases as the pH value decreases (as the acidity increases). Specifically, the etching rate for the thermal oxide film is 0.21 nm/minute if the aqueous hydrofluoric acid solution containing HCL at a concentration of 0% at a concentration of 0.1% is used, as shown in the uppermost column of FIG. 6. If the solution mixture of the aqueous hydrofluoric acid solution containing HF at a concentration of 0.1% and the aqueous hydrochloric acid solution containing HCL at a concentration of 0.6% added thereto is used, however, the etching rate for the thermal oxide becomes 0.13 nm/minute.

The etching rate for the NSG film also decreases as the pH value decreases (as the acidity increases). Specifically, the etching rate for the NSG film is 1.36 nm/minute if the aqueous hydrofluoric acid solution containing HCL at a concentration of 0% and HF at a concentration of 0.1% is used, as shown in the uppermost column of FIG. 6. If the solution mixture of the aqueous hydrofluoric acid solution containing HF at a concentration of 0.1% and the aqueous hydrochloric acid solution containing HCL at a concentration of 0.6% added thereto is used, however, the etching rate for the NSG film becomes 0.87 nm/minute.

Conversely, the etching rate for the BPSG film increases as the pH value decreases (as the acidity increases). Specifically, the etching rate for the BPSG film is 4.28 nm/minute if the aqueous hydrofluoric acid solution containing HCL at a concentration of 0% and HF at a concentration of 0.1% is used, as shown in the uppermost column of FIG. 6. If the solution mixture of the aqueous hydrofluoric acid solution containing HF at a concentration of 0.1% and the aqueous hydrochloric acid solution containing HCL at a concentration of 0.6% added thereto is used, however, the etching rate for the BPSG film becomes 5.98 nm/minute.

By contrast, the etching rate for the nitride film (simply referred to as SiN in FIG. 6; decreases as the pH value decreases (as the acidity increases), as shown in FIG. 1. Specifically, the etching rate for the nitride film is 0.11 nm/minute if the aqueous hydrofluoric acid solution containing HCL at a concentration of 0% and HF at a concentration of 0.1% is used, as shown in the uppermost column of FIG. 6. If the solution mixture of the aqueous hydrofluoric acid solution containing HF at a concentration of 0.1% and the aqueous hydrochloric acid solution containing HCL at a concentration of 0.6% added thereto is used, however, the etching rate for the nitride film becomes 0.05 nm/minute.

On the other hand, the etching rate for the phosphorus-doped polysilicon film (simply referred to as DPS in FIG. 6)

is constant without depending on the pH value, as shown in FIG. 1. Specifically, the etching rate for the polysilicon film is 0.02 nm/minute whether the HCL concentration is 0% or 0.6%, as shown in the uppermost column of FIG. 6.

Figure 2:
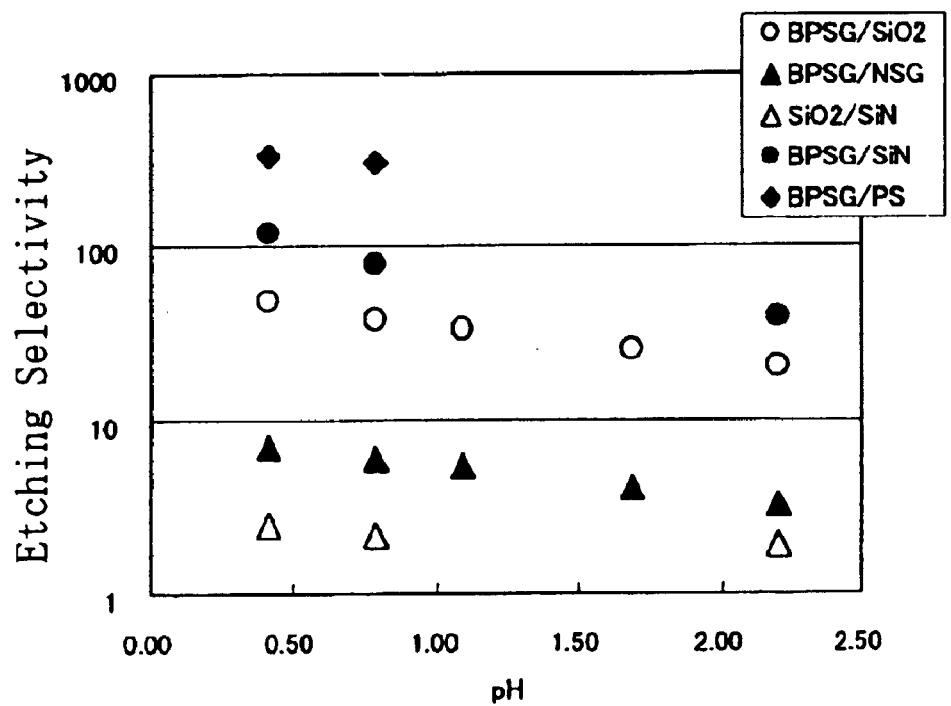
FIG. 2 is an etching-selectivity/pH interrelation diagram showing the interrelation between each of the BPSG-film/th-SiO$_2$-film etching selectivity and the BPSG-film/NSG-film etching selectivity and the pH of an aqueous etching solution.

FIG. 2 is an etching-selectivity/pH interrelation diagram showing the interrelation between each of the BPSG-film/th-SiO$_2$-film etching selectivity, the BPSG-film/NSG-film etching, selectivity, the SiO$_2$-film/SiN-film etching selectivity, the BPSG-film/SiN-film etching selectivity, and the BPSG-film/DPS-film etching selectivity and the pH value.

As shown in FIG. 2, the BPSG-film/th-SiO$_2$-film etching selectivity is 20.4 if the aqueous hydrofluoric acid solution containing HCL at a concentration of 0% and HF at a concentration of 0.1% is used. If the solution mixture of the aqueous hydrofluoric acid solution containing HF at a concentration of 0.1% and the aqueous hydrochloric acid solution containing HCL at a concentration of 0.03% to 0.6% added thereto is used, however, the BPSG-film/th-SiO$_2$-film etching selectivity increases to 25.2 to 47.8 as the HCL concentration increases (as the pH decreases).

As shown in FIG. 2, the BPSG-film/NSG-film etching selectivity is 3.1 if the aqueous hydrofluoric acid solution containing HCL at a concentration of 0% and HF at a concentration of 0.1% is used. If the solution mixture of the aqueous hydrofluoric acid solution containing HF at a concentration of 0.1% and the aqueous hydrochloric acid solution containing HCL at a concentration of 0.03% to 0.6% added thereto is used, however, the BPSG-film/NSG-film etching selectivity increases to 4.0 to 6.9 as the HCL concentration increases (as the pH decreases).

As shown in FIG. 2, the th-SiO$_2$-film/SiN-film etching selectivity is 1.9 if the aqueous hydrofluoric acid solution containing HCL at a concentration of 0% and HF at a concentration of 0.1% is used. If the solution mixture of the aqueous hydrofluoric acid solution containing HF at a concentration of 0.1% and the aqueous hydrochloric acid solution containing HCL at a concentration of 0.3% to 0.6% added thereto is used, however, the th-SiO$_2$-film/SiN-film etching selectivity increases to 2.1 to 2.5 as the HCL concentration increases (as the pH decreases).

As shown in FIG. 2, the BPSG-film/SiN-film etching selectivity is 1.9 if the aqueous hydrofluoric acid solution containing HCL at a concentration of 0% and HF at a concentration of 0.1% is used. If the solution mixture of the aqueous hydrofluoric acid solution containing HF at a concentration of 0.1% and the aqueous hydrochloric acid solution containing HCL at a concentration of 0.3% to 0.6% added thereto is used, however, the BPSG-film/SiN-film etching selectivity increases to 2.1 to 2.5 as the HCL concentration increases (as the pH decreases).

As shown in FIG. 2, the etching selectivities between the insulating films are dependent on the pH value. By varying the pH value, therefore, the etching selectivities can be controlled to an arbitrary value within a given range.

As can be seen from the result of the experiment, the th-SiO$_2$-film/SiN-film etching selectivity can be adjusted to a value within the range of 1.9 to 2.5 by controlling the pH value with the addition of an aqueous hydrochloric acid solution into the aqueous hydrofluoric acid solution containing HF at a concentration of 0.1%.

By further varying the concentration of HCL added to the aqueous hydrofluoric acid solution containing HF at a concentration of 0.1% within the ranges of, e.g., 0% to 0.3% and 0.6%, the BPSG-film/th-SiO$_2$-film etching selectivity can be adjusted to a value within the ranges of 20.4% to 36.7% and 36.7% to 44.8% and the BPSG-film/NSG-film etching selectivity can be adjusted to a value within the ranges of 3.1% to 5.9%, and 5.9% to 6.9%. In short, the etching selectivities can be controlled to an objective value within a given range by adding an inorganic acid and arbitrarily varying the pH.

Although the hydrochloric acid has been used for pH control, the effect achieved by the present embodiment is also achievable even if a sulfuric acid or a nitric acid, which is another inorganic acid, is used.

Fabrication Process

A description will be given next to the process for forming a sidewall composed of an SiN/NSG two-layer film having a generally L-shaped configuration over the side surfaces of the gate electrode of a MIS transistor.

Figure 3A:
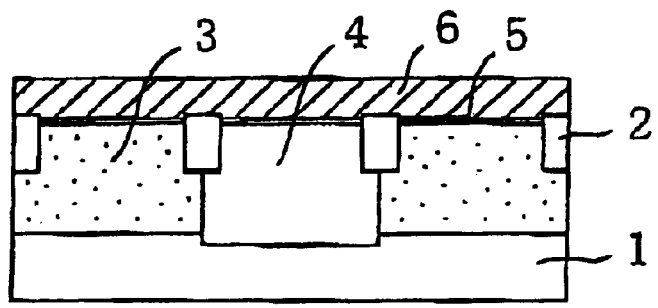
FIGS. 3A to 3D are cross-sectional views illustrating the process steps of forming a semiconductor device according to an embodiment of the present invention.

FIGS. 3A to 3D are cross-sectional views illustrating the process steps of fabricating the semiconductor device according to the first embodiment of the present invention. FIGS. 4A and 4B are cross-sectional views of MISFETs according to a conventional embodiment and the present embodiment, which show, for comparison, the respective remaining portions of SiN films and NSG films in the step shown in FIG. 3D.

First, in the step shown in FIG. 3A, th-SiO$_2$ films 2 (hereinafter referred to as an isolating oxide film) are formed in the isolation regions of a silicon substrate 1 by trench isolation (Shallow Trench Isolation: hereinafter referred to as STI) such that an n-type MISFET formation region Rnmis is defined by n-wells 3 and that a p-type MISFET Rpmis is defined by a p-well 4. Next, a gate insulating film 5 composed of a th-SiO$_2$ film, a polysilicon film 6, a barrier metal film 7 composed of a titanium nitride (TiN), a tungsten nitride (WN), or the like, a refractory metal film 8 such as a tungsten (W) film, and an SiN film 9 are deposited successively on the silicon substrate 1.

Figure 3B:
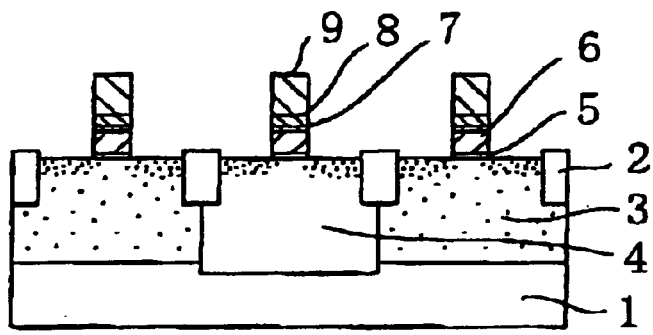
Figure 4A:
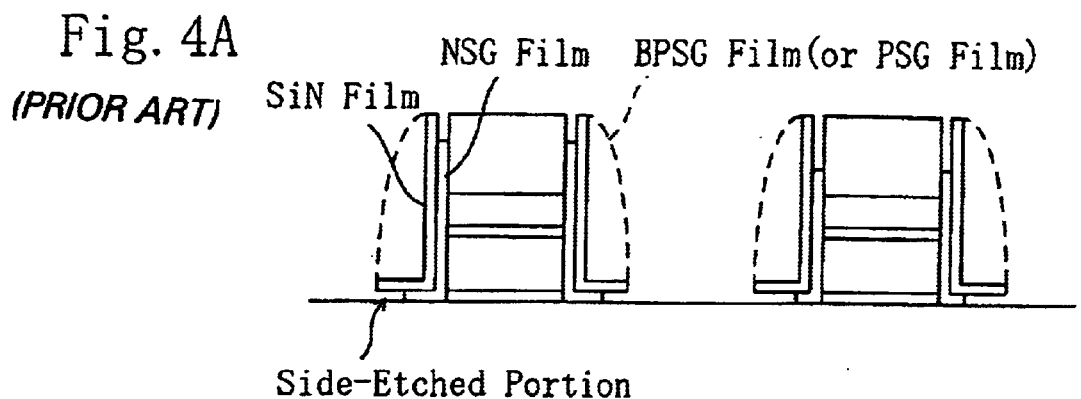
FIGS. 4A and 4B are cross-sectional views of MISFETs according to a conventional embodiment and an embodiment of the present invention, which show, for comparison, the respective remaining portions of SiN films and NSG films in the step shown in FIG. 3D.
Figure 4B:
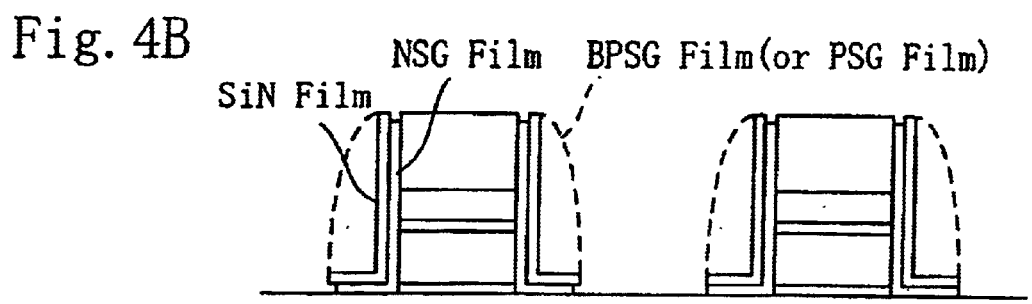

Next, in the step shown in FIG. 3B, etching is performed with respect to the SiN film 9 by using a resist pattern (not shown) covering a gate electrode formation region. Then, the resist pattern is removed by ashing. Thereafter, the refractory metal film 8, the barrier metal film 7, the polysilicon film 6, and the gate insulating film 5 are patterned by using the patterned SiN film 9 as a hard mask, whereby a polymetal gate electrode composed of the polysilicon film 6, the barrier metal film 7, and the refractory metal film 8 is formed on each of the n-type MISFET formation region Rnmis and on the p-type MISFET formation region Rpmis via the gate insulating film 5.

Instead of the polymetal gate structure, a gate electrode having a polysilicon gate structure or a metal gate structure composed of a refractory metal may also be formed.

Next, a photolithographic step is performed and then low-energy ion implantation and diffusion is performed by using the polymetal gate electrode as a mask, whereby shallow diffusion layers (lightly doped source/drain regions or extension regions) are formed.

Figure 3C:
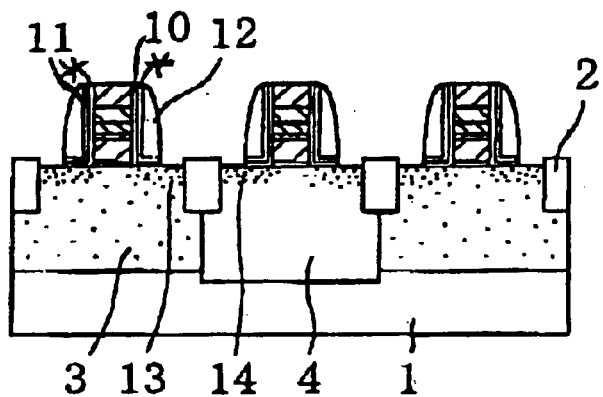

Then, in the step shown in FIG. 3C, an NSG film 10 with a thickness of about 10 nm serving as a first oxide film is deposited on the substrate by normal pressure CVD. An SiN film 11 with a thickness of about 10 nm is further deposited on the NSG film 10 by low pressure CVD. Subsequently, a BPSG (boron concentration: 3.5%, phosphorus concentration: 4.5%) film 12 with a thickness of about 60 nm serving as a second oxide film is deposited on the SiN film 11 by normal pressure CVD. As the first oxide film, a TEOS film, a HTO film, or a plasma oxide film may also be used instead of the NSG film. As the second oxide film, a PSG film may also be used instead of the BPSG film.

After an RTA process is performed at 800° C. for 10 seconds for annealing, an etch-back process is performed, thereby forming a sidewall for LDD having a three-layer structure composed of the BPSG film (or PSG film), the SiN film, and the NSG film.

Subsequently, in the step shown in FIG. 3D, a photolithographic step and an implantation step are performed, followed by the formation of a p-type diffusion layer 13 and all n-type diffusion layer 14 serving as surface diffusion layers forming source/drain regions. By further selectively removing the BPSG film 12 by wet etching, an n-type MISFET and a p-type MISFET having the SiN film 11 and the NSG film 10 are formed on the side surfaces of the polymetal gate electrode.

As shown in FIG. 4A, the oxide film etched by a conventional process using vapor-phase HG undergoes a process damage so that the BPSG-film/NSG-film etching selectivity is reduced. Moreover, the NSG film is also partly etched during the removal of the BPSG film so that side-etched portions are formed. If a silicide, which is not shown in FIG. 4A, is formed on the side-etched portions of the NSG film in the subsequent silicide forming step, the silicide layer may come in contact with the channel region to cause a failure in electric property.

According to the present embodiment, by contrast, the silicon substrate is immersed for 15 minutes in the aqueous solution mixture of the aqueous hydrofluoric acid solution containing HF at a concentration of 0.1% and the hydrochloric acid containing HCL at a concentration of 0.3%, cleaned with water, subjected to a 3-minute rinsing process using water (hereinafter referred to as an aqueous ozone) containing 5 ppm of ozone ($O_3$) at a weight ratio, cleaned with water again, and dried.

As a result, the etching of the isolating oxide films 2, the side-etching of the NSG film 10, and the like are suppressed as shown in FIG. 4B. This is because, in the case where wet etching is performed by using the solution mixture according to the present embodiment, a change in etching rate caused by process damage is intrinsically small and the etching selectivity between the NSG film and the BPSG film as the oxide films having different properties is 5.9, which is higher in the case where the hydrofluoric acid containing HF at a concentration of 0.1% is used, compared with the etching selectivity of a conventional wet-etching process.

In that case, the use of an aqueous solution containing a hydrofluoric acid at a concentration selected from the range of 0.01 to 1.0 wt % and an inorganic acid at a concentration selected from the range of 0.001 to 1.0 wt % allows the present invention to surely achieve its effects.

Since the semiconductor substrate is processed with the aqueous ozone after wet etching, a chemical oxide film is formed over the p-type and n-type diffusion layers 13 and 14 of the semiconductor substrate. This also suppresses the occurrence of a stain on the semiconductor substrate surface and allows an excellent silicide layer to be formed. In this case, the concentration of ozone in the solution containing the aqueous ozone is selected properly from the range of 0.1 to 150.0 ppm. By setting the concentration and a processing, time selectively and appropriately, optimum conditions can be established empirically.

Instead of the foregoing rinsing process using the aqueous ozone, a process using a solution containing an aqueous hydrogen peroxide at a proper concentration may also be used practically. In this case, the concentration of a hydrogen peroxide is selected properly from the range of 0.01 to 30.0 wt %. By setting the concentration and a processing time selectively and appropriately, the optimum conditions can be established empirically.

Variation of Fabrication Process

Figure 5A:
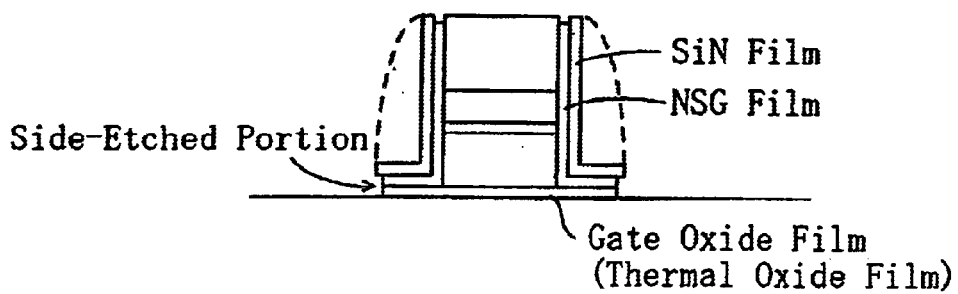
FIGS. 5A and 5B are cross-sectional views illustrating some of fabrication process steps for semiconductor devices according to two variations of the embodiment of the present invention.
Figure 5B:
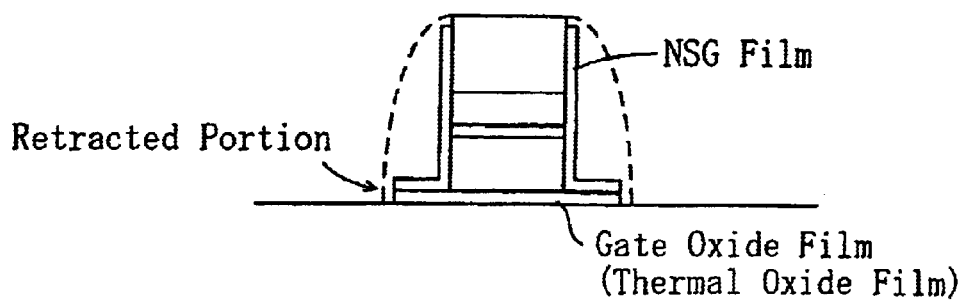

FIGS. 5A and 5B are cross-sectional views illustrating some of process steps of fabricating semiconductor devices according to two variations of the foregoing embodiment.

Figure 3D:
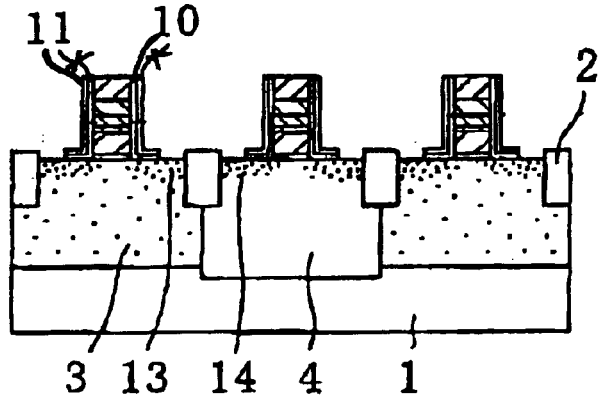

FIG. 5A shows a configuration of a two-layer-film sidewall formed in the step shown in FIG. 3D when the gate insulating film composed of the thermal oxide film is hardly etched to be left on the substrate in forming the gate electrode by patterning the polysilicon film and the like in the step shown in FIG. 3B. Specifically, the three-layer-film sidewall is formed by the etch-back process in the step shown in FIG. 3C, while the exposed portions uncovered with the three-layer-film sidewall are removed. Then, the BPSG film (or the PSG film) is removed selectively by using the etching solution composed of the aqueous solution mixture according to the foregoing embodiment in the step shown in FIG. 3D. At this time, the BPSG film (or the PSG film) can be etched selectively with the gate insulating film composed of the thermal oxide film and the NSG film being nearly entirely left. Although a stain may occur on the surface of the silicon substrate as a result of the wet etching, a chemical oxide film is formed by subsequently cleaning the substrate by using a solution containing an aqueous hydrogen peroxide or an aqueous ozone. Since the occurrence of a stain on the surface of the semiconductor substrate is also suppressed, an excellent silicide layer can be formed. In this case, the concentration of ozone in the aqueous ozone is selected properly from the range of 0.1 to 150.0 ppm at a weight ratio. By setting the concentration and a processing time selectively and appropriately, the optimum conditions can be established empirically.

FIG. 5B shows a configuration of a single-layer-film sidewall formed in the step shown in FIG. 3D when the nitride film (SiN film) is not provided and the gate insulating film composed of the thermal oxide film is hardly etched to be left on the substrate. Specifically the two-layer-film sidewall composed of the NSG film and the BPSG film (or the PSG film) is formed by the etch-back process in the step shown in FIG. 3C, while the exposed portions uncovered with the two-layer-film sidewall are removed. Then, the BPSG film (or the PSG film) is removed selectively by using the etching solution composed of the aqueous solution mixture according to the foregoing embodiment in the step shown in FIG. 3D. At this time, the BPSG film (or the PSG film) can be etched selectively with the gate insulating film composed of the thermal oxide film and the NSG film beings nearly entirely left. Although a stain may occur on the surface of the silicon substrate as a result of the wet etching, a chemical oxide film is formed by subsequently cleaning the substrate by using a solution containing an aqueous hydrogen peroxide or an aqueous ozone. Since the occurrence of a stain on the surface of the semiconductor substrate is also suppressed, an excellent silicide layer can be formed. In addition, an organic solvent component can also be removed. In this case also, the concentration of ozone in the aqueous ozone is selected properly from the range of 0.1 to 150.0 ppm at a weight ratio. By setting the concentration and a processing time selectively and appropriately, the optimum conditions can be established empirically.

Other Variations of

EMBODIMENT 1

Although the first embodiment has interposed the SiN film between the NSG film and the BPSG film, the present invention is also applicable to the case where the SiN film is not present.

The same effects as achieved by the foregoing embodiment are also achievable if a TEOS film or a plasma oxide film is used instead of the NSG film.

Although the first embodiment has described the case where the two oxide films are used, the present invention is not limited to such an embodiment. The present invention is also applicable to the case where three or more oxide films having different etching properties are used.

The same effects as achieved by the foregoing embodiment are achievable if a PSG film is used instead of the BPSG film used in the first embodiment.

Although the first embodiment has used the thermal oxide film (th-SiO$_2$ film) as the gate insulating film, a silicon oxynitride film formed by nitriding an oxide film, a silicon nitride film, or the like may also be used as the gate insulating film.

EMBODIMENT 2

FIGS. 7A to 7G are cross-sectional views illustrating the process steps of fabricating a semiconductor device according to a second embodiment of the present invention. In the present embodiment, a description will be given to an exemplary case where the present invention is applied to the process of forming an isolation (STI (Shallow Trench Isolation)) region composed of an insulating film.

Figure 7A:
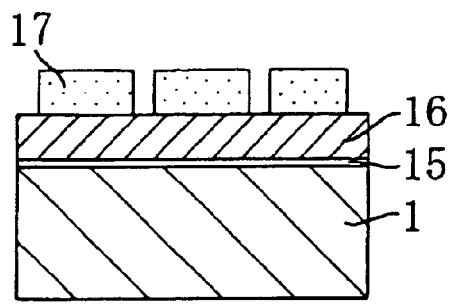

First, in the step shown in FIG. 7A, a protective oxide film 15 with a thickness of 10 nm and a nitride film 16 with a thickness of 160 nm are deposited successively on a silicon substrate 1. Then, a resist mask 17 is formed on the nitride film 16 by photolithography.

Figure 7B:
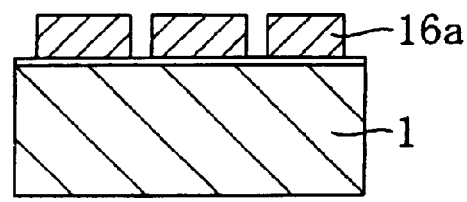

Next, in the step shown in FIG. 7B, dry etching is performed with respect to the nitride film 16 by using the resist mask 17, thereby forming a nitride film mask 16*a*. Then, resist residues and a polymer are removed by SPM (Sulfuric Acid-Hydrogen Peroxide, Mixture) cleaning (cleaning using a solution mixture of a sulfuric acid and an aqueous hydrogen peroxide) and APM (Ammonia-Hydrogen Peroxide, Mixture) cleaning (cleaning using a solution mixture of ammonia and an aqueous hydrogen peroxide).

Figure 7C:
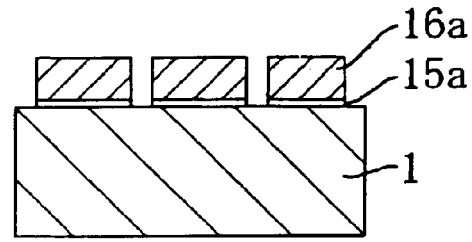

Next, in the step shown in FIG. 7C, the silicon substrate is immersed in an aqueous solution mixture of an aqueous hydrofluoric acid solution containing HF at 0.5% and a hydrochloric acid containing HCL at a concentration of 0.6% for 15 minutes by using the nitride film mask 16*a* and then cleaned with water. At that time, the protective oxide film 15 is patterned to form a pad film 15*a*. Subsequently, the silicon substrate is subjected to a 3-minute rinsing process using water (hereinafter referred to as an aqueous ozone) containing 5 ppm of ozone (O$_3$) at a weight ratio, cleaned with water, and dried. This suppresses etching of the side surfaces of the SiN film and reduces size variations in active region, compared with oxide-film wet etching using HF. By subsequently performing cleaning with a solution containing an aqueous hydrogen peroxide or an aqueous ozone, a chemical oxide film is formed so that the occurrence of a stain on the upper surface of the silicon substrate is also suppressed.

Figure 7D:
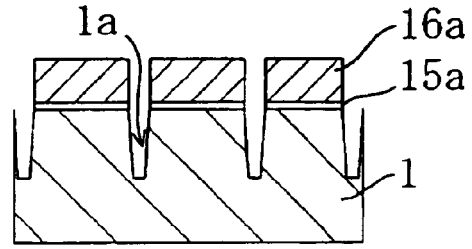
Figure 7D:
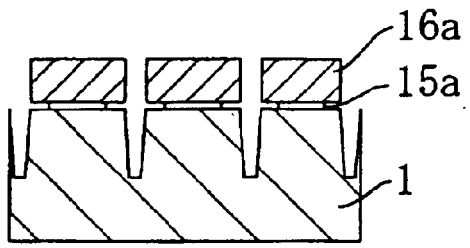

Next, in the step shown in FIG. 7D, the silicon substrate 1 is etched by dry etching using the nitride film mask 16*a* and the pad film 15*a* so that trenches 1*a* are formed therein. Thereafter, SPM and APM cleaning is performed to remove a polymer remaining after the dry etching of the silicon substrate.

Next, in the step shown in FIG. 7E, the following process is performed to retract the pad film 15*a* prior to the oxidation of the wall portions of the trenches 1*a* and thereby round off the edges of the trenches 1*a*. First, the substrate is immersed in an aqueous solution mixture of an aqueous hydrofluoric acid solution containing HF at a concentration of 0.5% and a hydrochloric acid containing HCL at a concentration of 0.6% for 15 minutes so that the side surface portions of the oxide mask 15*a* are etched selectively. Subsequently, the silicon substrate is subjected to a 3-minute rinsing process using water (hereinafter referred to as an aqueous ozone) containing 5 ppm of ozone (O$_3$) at a weight ratio, cleaned with water, and dried.

Figure 7F:
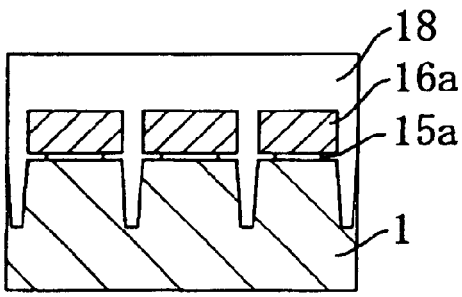

Next, in the step shown in FIG. 7F, the wall portions of the trenches 1*a* are oxidized, whereby the edges of the trenches are rounded off. Then, a silicon oxide film 18 is deposited on the substrate to fill in the trenches 1*a*.

Figure 7G:
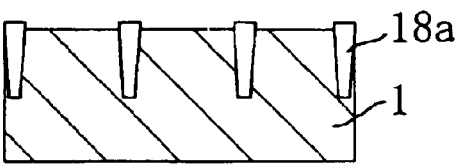

Next, in the step shown in FIG. 7G, CMP is performed till the nitride film mask 16*a* is exposed, thereby forming an insulating film 18*a* for isolation composed of the silicon oxide film 18 buried in the trenches 1*a*. Thereafter, the nitride film mask 16*a* and the pad film 15*a* are etched away.

Compared with oxide-film wet etching using HF that has been used conventionally, the STI forming process according to the present embodiment can suppress etching of the side surfaces of the SiN film and reduce size variations in active region.

By the subsequent cleaning process using the solution containing the aqueous hydrogen peroxide or the aqueous ozone, the chemical oxide film is formed so that the occurrence of a stain on the semiconductor substrate surface is also suppressed.

EMBODIMENT 3

FIGS. 8A to 8D are cross-sectional views illustrating the process steps of fabricating, a semiconductor device according to a third embodiment of the present invention. In the present embodiment, a description will be given to an exemplary case where the present invention is applied to the process steps of fabricating the semiconductor device including a capacitor electrode having a no-lid closed-end cylindrical structure and composed of a HSG (Hemispherical Grained) polysilicon layer having hemispherical grains. A silicon substrate formed with a memory cell transistor and the like is present under an interlayer film, though the depiction thereof is omitted in FIGS. 8A to 8D.

Figure 8A:
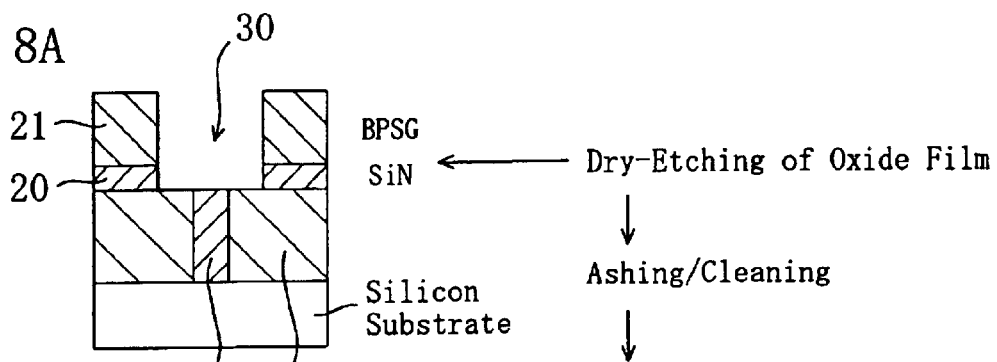
FIGS. 8A to 8D are cross-sectional views illustrating fabrication process steps for a semiconductor device according to a third embodiment of the present invention.

First, in the step shown in FIG. 8A, a nitride film having a thickness of 50 nm, a spacer layer having a thickness of 500 nm and composed of an etchable material such as a BPSG film, and a TEOS film having a thickness of 20 nm are deposited successively on an interlayer film (e.g., an NSG film) 29 containing a polysilicon plug 28. Then, a resist mask is formed. By using the resist mask, the TEOS film and the spacer layers are subjected to dry etching, ashing, and cleaning, while the nitride film is subjected to dry etching, ashing and cleaning, whereby a nitride film flange 20 and a cylindrical spacer 21 each surrounding a depressed portion 30 are formed. At this time, the TEOS film is removed.

Figure 8B:
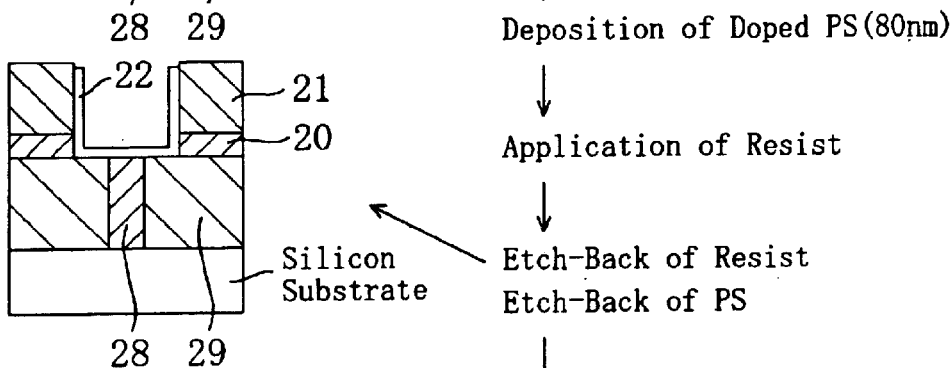

Next, in the step shown in FIG. 8B, a natural oxide film on the polysilicon plug 28 is removed therefrom by BHF cleaning. Then, a doped silicon film (hereinafter referred to as the DPS film) having a thickness of 30 nm and a resist film are deposited and etched back, whereby a closed-end cylindrical DPS film 22 is formed along the wall surfaces of the depressed portion 30. A cleaning step is further performed to remove resist residues and the like on the substrate surface therefrom.

Figure 8C:
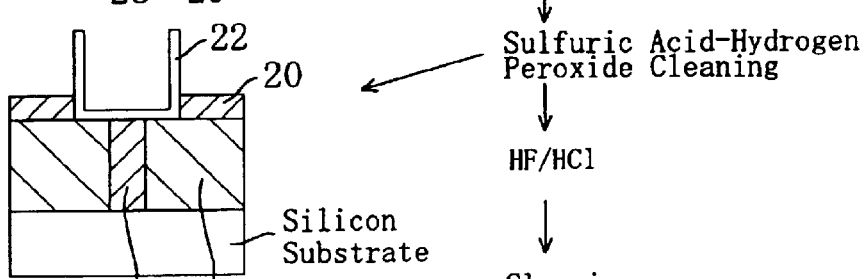

Next, in the step shown in FIG. 8C, wet etching using a solution mixture of 0.1% HF and 0.6% HCL is performed at 23° C. for 120 minutes by using the nitride film flange 20 and the closed-end cylindrical DPS film 22 as etching stopper films. At that time, the cylindrical spacer 21 composed of the BPSG film is etched under the condition that an etching selectivity to each of the nitride film flange 20 and the closed-end cylindrical DPS film 22 is 100 or more, so that the cylindrical spacer 21 composed of the BPSG film is removed. As a result, the capacitor electrode having the closed-end cylindrical structure (no-lid closed-end cylindrical structure) is formed.

Figure 8D:
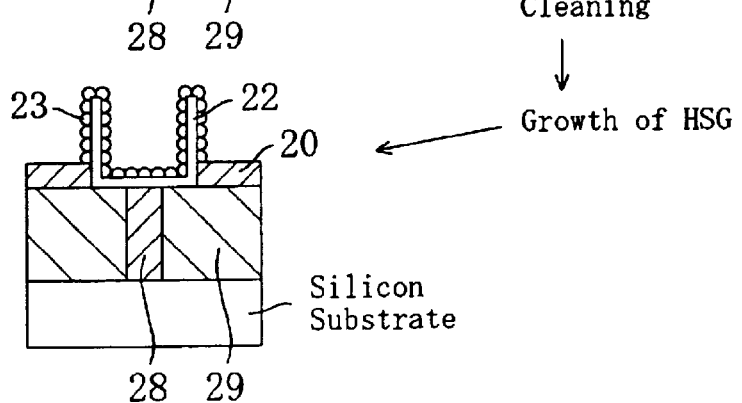

Next, in the step shown in FIG. 8D, a wafer formed with the capacitor electrode having the no-lid closed-end cylindrical structure is carried into a reaction furnace (not shown) and then a $SiH_4$ gas is introduced into the reaction furnace to be applied to the wafer, while the temperature is held at 620° C., whereby a hemispherical silicon crystal nuclei are formed on the closed-end cylindrical DPS film 22. Then, an annealing process is performed with respect to the wafer, while holding the temperature at 620° C. in high vacuum, thereby localizing silicon atoms in the closed-end cylindrical DPS film into the silicon crystal nuclei already formed. As a result, the silicon crystal nuclei expand to form HSGs 23, as shown in FIG. 8D, and the capacitor electrode having the HSGs is thus formed.

The fabrication process according to the present embodiment can achieve the following effects. The conventionally used etching process using vapor-phase HF has the problems of insufficient removal of residues resulting from the etching of the oxide film and the occurrence of particles, which may cause a reduction in production yield. By using the wet etching method according to the present embodiment, however, the oxide film can be etched reliably without causing such disadvantages.

What is claimed is:

1. A method for fabricating a semiconductor device having a MIS transistor composed of a gate insulating film provided on a semiconductor substrate and a gate electrode provided thereon, the method comprising the steps of:

(a) forming a sidewall including a first oxide film and a second oxide film having different etching properties over side surfaces of the gate electrode;

(b) performing ion implantation for forming source/drain regions by using the sidewall as a mask; and (c) etching the sidewall by using an aqueous solution mixture containing a hydrofluoric acid and an inorganic acid to selectively remove the second oxide film, wherein the step (a) includes the substeps of:

forming the first oxide film on each of an upper surface and side surfaces of the gate electrode;

forming a nitride film on the first oxide film;

forming a second oxide film on the nitride film; and etching back the second oxide film to form a multilayer film sidewall composed of a two-layer film including the first oxide film and the nitride him each having a generally L-shape configuration and of the second oxide film having sectoral configuration, and the step (c) includes forming on the side surfaces of the gate electrode, a two-layer film sidewall composed of the first oxide film and the nitride film each having a generally L-shaped configuration.

2. The method of claim 1, wherein the step (a) includes forming a nondoped silicon oxide film as the first oxide film and forming a doped silicon oxide film as the second oxide film.

3. The method of claim 2, wherein the nondoped silicon oxide film is an NSG film, a TEOS film, a HTO film, or a plasma oxide film and the doped oxide film is a BPSG film, a PSG film, or a BSG film.

4. The method of claim 1, wherein the step (c) includes using, as the aqueous solution mixture, an aqueous solution containing a hydrofluoric acid at a concentration selected from the range of 0.01 to 1.0 wt % and an inorganic acid at a concentration selected from the range of 0.001 to 30.0 wt %.

5. The method of claim 1, wherein the step (c) includes using a hydrochloric acid, a sulfuric acid, or a nitric acid as the inorganic acid.

6. The method of claim 1, wherein the gate electrode is composed of polysilicon, polymetal, or metal.

7. The method of claim 1, further comprising, after the step (c), the step of cleaning with a solution containing an aqueous hydrogen peroxide or an aqueous ozone.

8. The method of claim 7, wherein a concentration of the hydrogen peroxide in the solution containing the aqueous hydrogen peroxide is in the range of 0.01 to 30.0 wt %.

9. The method of claim 7, wherein a concentration of the ozone in the solution containing, the aqueous ozone is in the range of 0.1 to 150.0 ppm.

10. The method of claim 1, wherein in the substep of forming a multilayer-film sidewall in the step (a), alter etching back the second oxide film, the nitride film and the second oxide film are sequentially etched to form the multilayer-film sidewall composed of the second oxide film, which has a sectoral configuration, and the two-layer film, which includes the first oxide film and the nitride film each having a generally L-shaped configuration, the two-layer film being formed by removing portions other than the portions of the first oxide film and the nitride film located under the second oxide film on the semiconductor.

11. A method for fabricating a semiconductor device including an insulating film for isolation, the method comprising the steps of:

(a) successively forming, on a semiconductor substrate, a protective film and an anti-oxidation film having different etching properties;

(b) patterning the anti-oxidation film to form an etching mask therefrom;

(c) etching the protective film with the etching mask being attached thereto by using an aqueous solution mixture containing a hydrofluoric acid and an inorganic acid to leave a pad film under the etching mask;

(d) performing dry etching with respect to the semiconductor substrate with the etching mask being attached thereto form a trench therein; and (e) etching side-surface portions of the pad film exposed in the trench by using an aqueous solution mixture containing a hydrofluoric acid and an inorganic acid.

12. The method of claim 11, wherein the step (a) includes forming a silicon oxide film as the protective film and forming a silicon nitride film as the anti-oxidation film.

13. The method of claim 11, wherein each of the steps (c) and (e) includes using, as the aqueous solution mixture, an aqueous solution containing a hydrofluoric acid at a concentration selected from the range of 0.01 to 1.0 wt % and an inorganic acid at a concentration selected from the range of 0.001 to 30.0 wt %.

14. The method of claim 13, wherein each of the steps (c) and (e) includes using a hydrochloric acid, a sulfuric acid, or a nitric acid as the inorganic acid.

15. The method of claim 11, further comprising, after the steps (c) and (e), the step of cleaning with a solution containing an aqueous hydrogen peroxide or an aqueous ozone.

16. The method of claim 15, wherein a concentration of the hydrogen peroxide in the solution containing the aqueous hydrogen peroxide is in the range of 0.01 to 30.0 wt %.

17. The method of claim 16, wherein a concentration of the ozone in the solution containing the aqueous ozone is in the range of 0.1 to 150.0 ppm.

* * * * *